United States Patent
Date

(10) Patent No.: US 10,658,042 B2
(45) Date of Patent: May 19, 2020

(54) SEMICONDUCTOR MEMORY DEVICE AND METHOD OF ERASING DATA OF PARTIAL PAGE AND OVERWRITING PARTIAL PAGE WITH PREDETERMINED DATA

(71) Applicant: Sony Corporation, Tokyo (JP)

(72) Inventor: Kazuyuki Date, Kanagawa (JP)

(73) Assignee: Sony Corporation, Tokyo (JP)

(*) Notice: Subject to any disclaimer, the term of this patent is extended or adjusted under 35 U.S.C. 154(b) by 0 days.

(21) Appl. No.: 15/758,021

(22) PCT Filed: Aug. 4, 2016

(86) PCT No.: PCT/JP2016/072919
§ 371 (c)(1),
(2) Date: Mar. 7, 2018

(87) PCT Pub. No.: WO2017/047272
PCT Pub. Date: Mar. 23, 2017

(65) Prior Publication Data
US 2018/0254088 A1    Sep. 6, 2018

(30) Foreign Application Priority Data
Sep. 15, 2015   (JP) .................... 2015-181628

(51) Int. Cl.
| G11C 16/16 | (2006.01) |
| G06F 3/08 | (2006.01) |
| G11C 11/56 | (2006.01) |
| G06F 3/06 | (2006.01) |
| G06F 12/02 | (2006.01) |
| G11C 16/26 | (2006.01) |
| G11C 16/04 | (2006.01) |

(52) U.S. Cl.
CPC ............ G11C 16/16 (2013.01); G06F 3/0608 (2013.01); G06F 3/0652 (2013.01); G06F 3/0679 (2013.01); G06F 3/08 (2013.01); G06F 12/0246 (2013.01); G11C 11/5628 (2013.01); G11C 16/26 (2013.01); G06F 2212/7205 (2013.01); G11C 16/0483 (2013.01)

(58) Field of Classification Search
CPC ......... G11C 16/16; G11C 16/26; G11C 16/04; G11C 16/02; G11C 16/0483; G11C 16/14; G06F 3/08
See application file for complete search history.

(56) References Cited

U.S. PATENT DOCUMENTS

| 2005/0168770 A1* | 8/2005 | Kurose | ................. G06F 3/1212 358/1.15 |
| 2014/0143475 A1* | 5/2014 | Kasorla | ................. G11C 16/10 711/103 |
| 2016/0155495 A1* | 6/2016 | Oh | ...................... G06F 12/0246 365/185.03 |

FOREIGN PATENT DOCUMENTS

| JP | 2014-038687 A | 2/2014 |
| JP | 2014-096122 A | 5/2014 |

* cited by examiner

*Primary Examiner* — Sultana Begum
(74) *Attorney, Agent, or Firm* — Michael Best & Friedrich LLP

(57) ABSTRACT

A semiconductor memory device and method of erasing data are disclosed. In one example, a semiconductor memory device includes a block including a plurality of pages and a controller that controls writing, erasing, and reading of data. Each of the pages includes a plurality of memory cells each being changeable to a number of states. In a case of erasing only a partial page of the plurality of pages, the controller overwrites the partial page with predetermined data that causes state change only by one stage.

9 Claims, 12 Drawing Sheets

| | STATE | ERASURE STATE | A STATE | B STATE | C STATE |
|---|---|---|---|---|---|
| DATA BEFORE OVERWRITING | PAGE A | 1 | 1 | 0 | 0 |
| | PAGE B | 1 | 0 | 0 | 1 |
| OVERWRITING DATA OF PAGE B(ALL1) | | 1 | 1 | 1 | 1 |
| DATA OF PAGE B AFTER OVERWRITING | STATE | ERASURE STATE | A STATE | C STATE | C STATE |
| | PAGE A | 1 | 1 | 0 | 0 |
| | PAGE B | 1 | 0 | 1 | 1 |
| OVERWRITING DATA OF PAGE A (LOGICAL PRODUCT) | | 1 | 0 | 0 | 0 |
| DATA OF PAGES B AND A AFTER OVERWRITING | STATE | ERASURE STATE | B STATE | C STATE | C STATE |
| | PAGE A | 1 | 0 | 0 | 0 |
| | PAGE B | 1 | 0 | 1 | 1 |

| | STATE | ERASURE STATE | A STATE | B STATE | C STATE |
|---|---|---|---|---|---|
| DATA BEFORE OVERWRITING | PAGE A | 1 | 1 | 0 | 0 |
| | PAGE B | 1 | 0 | 0 | 1 |
| OVERWRITING DATA OF PAGE A (LOGICAL PRODUCT) | | 1 | 0 | 0 | 0 |
| DATA OF PAGE A AFTER OVERWRITING | STATE | ERASURE STATE | B STATE | B STATE | C STATE |
| | PAGE A | 1 | 0 | 0 | 0 |
| | PAGE B | 1 | 0 | 0 | 1 |
| OVERWRITING DATA OF PAGE B(ALL0) | | 0 | 0 | 0 | 0 |
| DATA OF PAGES A AND B AFTER OVERWRITING | STATE | A STATE | B STATE | C STATE | C STATE |
| | PAGE A | 1 | 0 | 0 | 0 |
| | PAGE B | 0 | 0 | 0 | 1 |

[ FIG. 1 ]
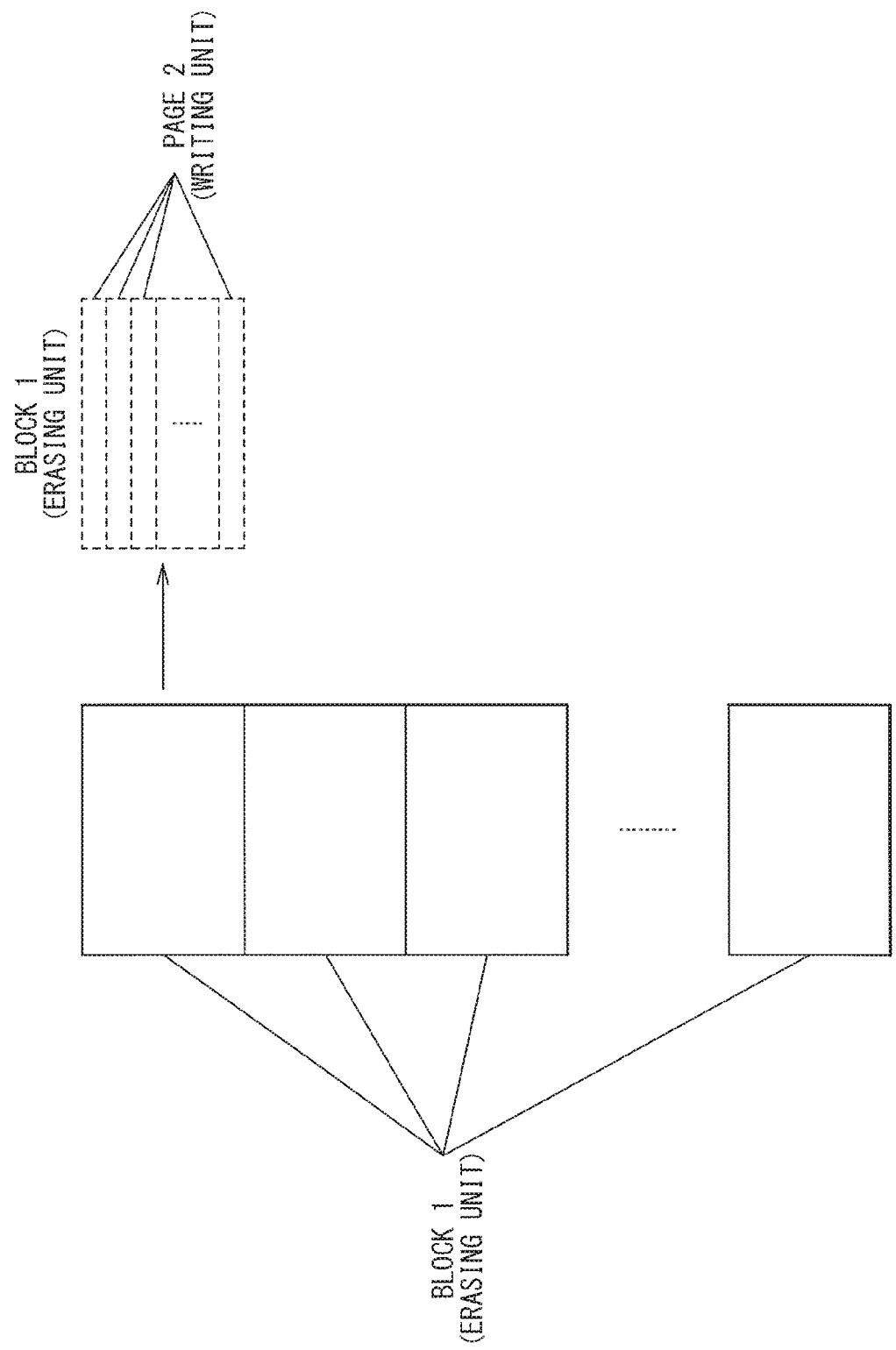

[FIG. 2]
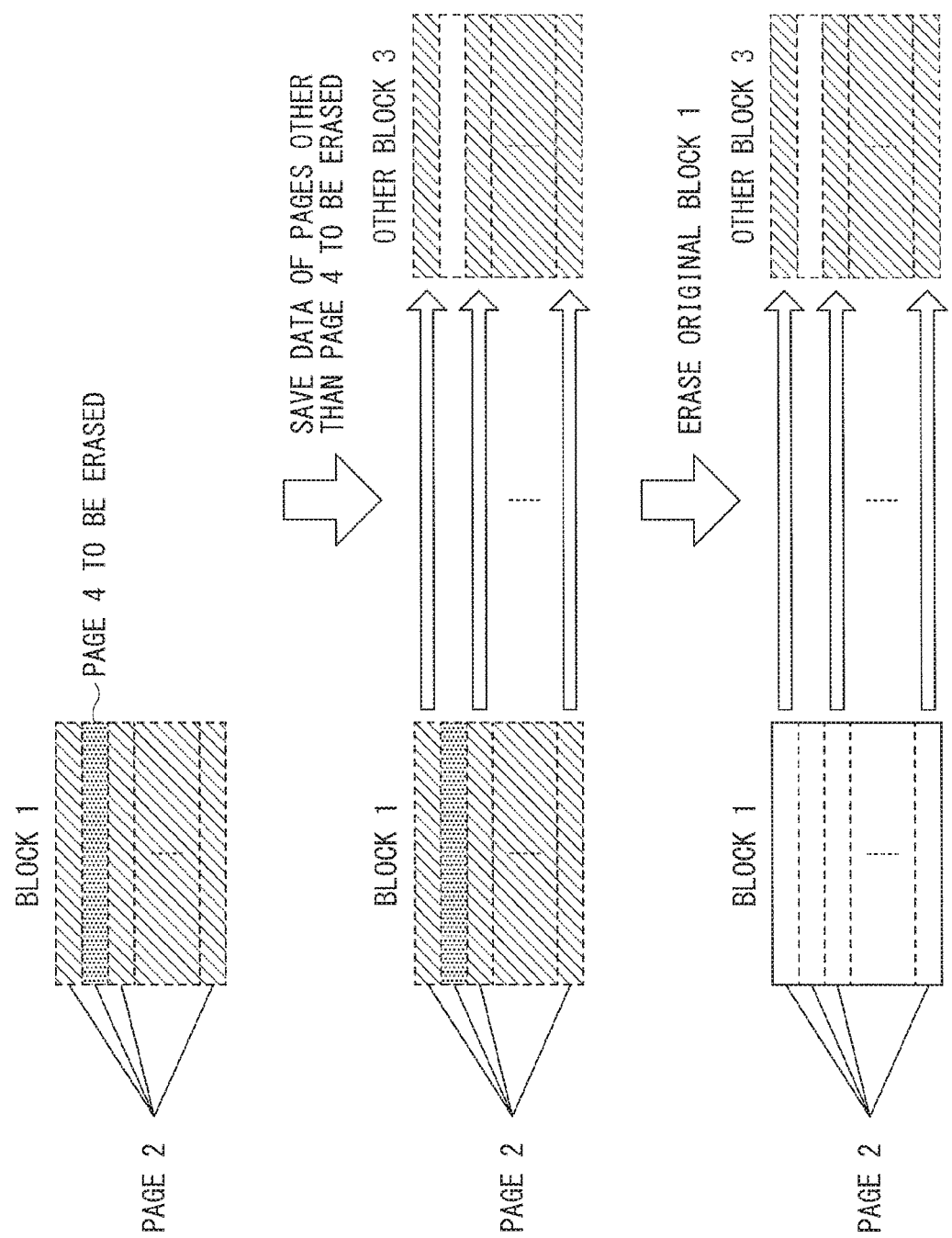

[ FIG. 3 ]
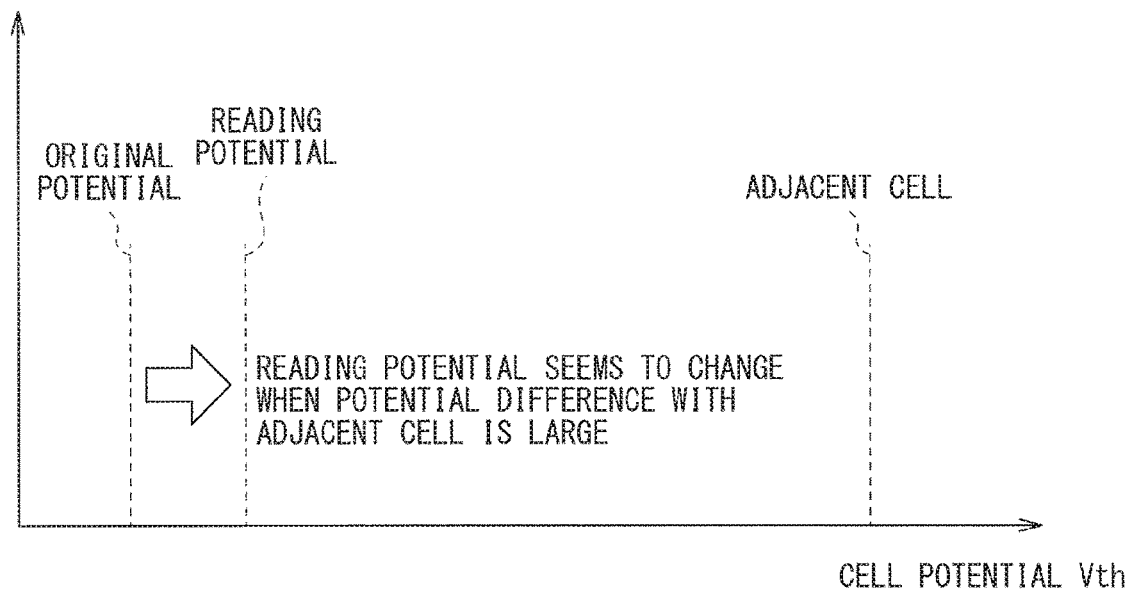
[ FIG. 4 ]
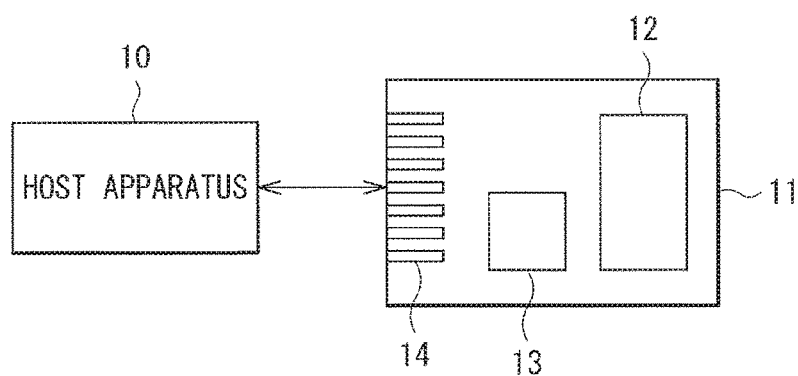

[ FIG. 5 ]
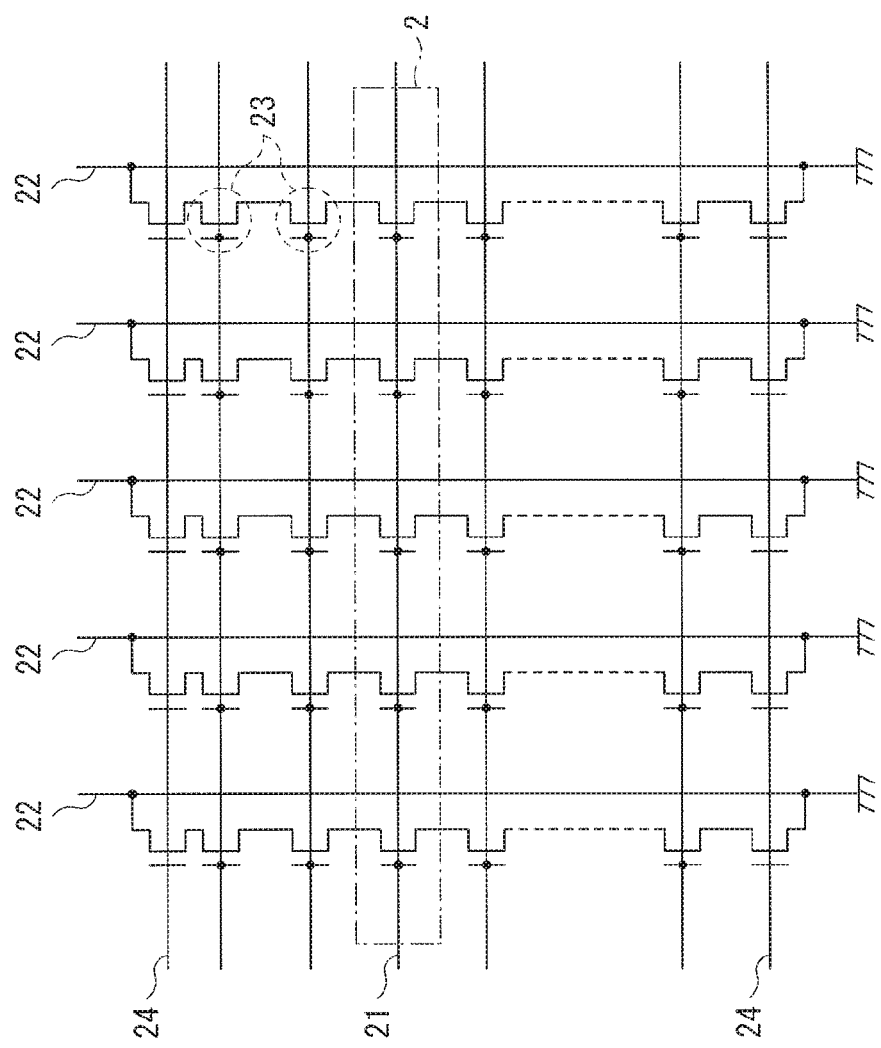

[ FIG. 6 ]

| | STATE | ERASURE STATE | A STATE | B STATE | C STATE |
|---|---|---|---|---|---|
| DATA BEFORE OVERWRITING | PAGE A | 1 | 1 | 0 | 0 |
| | PAGE B | 1 | 0 | 0 | 1 |
| OVERWRITING DATA OF PAGE A (LOGICAL PRODUCT) | | 1 | 0 | 0 | 0 |
| DATA AFTER OVERWRITING | STATE | ERASURE STATE | B STATE | B STATE | C STATE |
| | PAGE A | 1 | 0 | 0 | 0 |
| | PAGE B | 1 | 0 | 0 | 1 |

[ FIG. 7 ]

| | | ERASURE STATE | A STATE | B STATE | C STATE |
|---|---|---|---|---|---|
| DATA BEFORE OVERWRITING | STATE | ERASURE STATE | A STATE | B STATE | C STATE |
| | PAGE A | 1 | 1 | 0 | 0 |
| | PAGE B | 1 | 0 | 0 | 1 |
| OVERWRITING DATA OF PAGE B (ALL 1) | | 1 | 1 | 1 | 1 |
| DATA OF PAGE B AFTER OVERWRITING | STATE | ERASURE STATE | A STATE | C STATE | C STATE |
| | PAGE A | 1 | 1 | 0 | 0 |
| | PAGE B | 1 | 0 | 1 | 1 |
| OVERWRITING DATA OF PAGE A (LOGICAL PRODUCT) | | 1 | 1 | 0 | 0 |
| DATA OF PAGES B AND A AFTER OVERWRITING | STATE | ERASURE STATE | B STATE | C STATE | C STATE |
| | PAGE A | 1 | 0 | 0 | 0 |
| | PAGE B | 1 | 1 | 0 | 1 |

[ FIG. 8 ]

| | STATE | ERASURE STATE | A STATE | B STATE | C STATE |
|---|---|---|---|---|---|
| DATA BEFORE OVERWRITING | PAGE A | 1 | 1 | 0 | 0 |
| | PAGE B | 1 | 0 | 0 | 1 |
| OVERWRITING DATA OF PAGE A (LOGICAL PRODUCT) | | 1 | 0 | 0 | 0 |
| DATA OF PAGE A AFTER OVERWRITING | STATE | ERASURE STATE → | B STATE | B STATE | C STATE |
| | PAGE A | 1 | 0 | 0 | 0 |
| | PAGE B | 1 | 0 | 0 | 1 |
| OVERWRITING DATA OF PAGE B (ALL 0) | | 0 | 0 | 0 | 0 |
| DATA OF PAGES A AND B AFTER OVERWRITING | STATE | A STATE | B STATE | C STATE | C STATE |
| | PAGE A | 1 | 0 | 0 | 0 |
| | PAGE B | 0 | 0 | 0 | 1 |

[ FIG. 9 ]
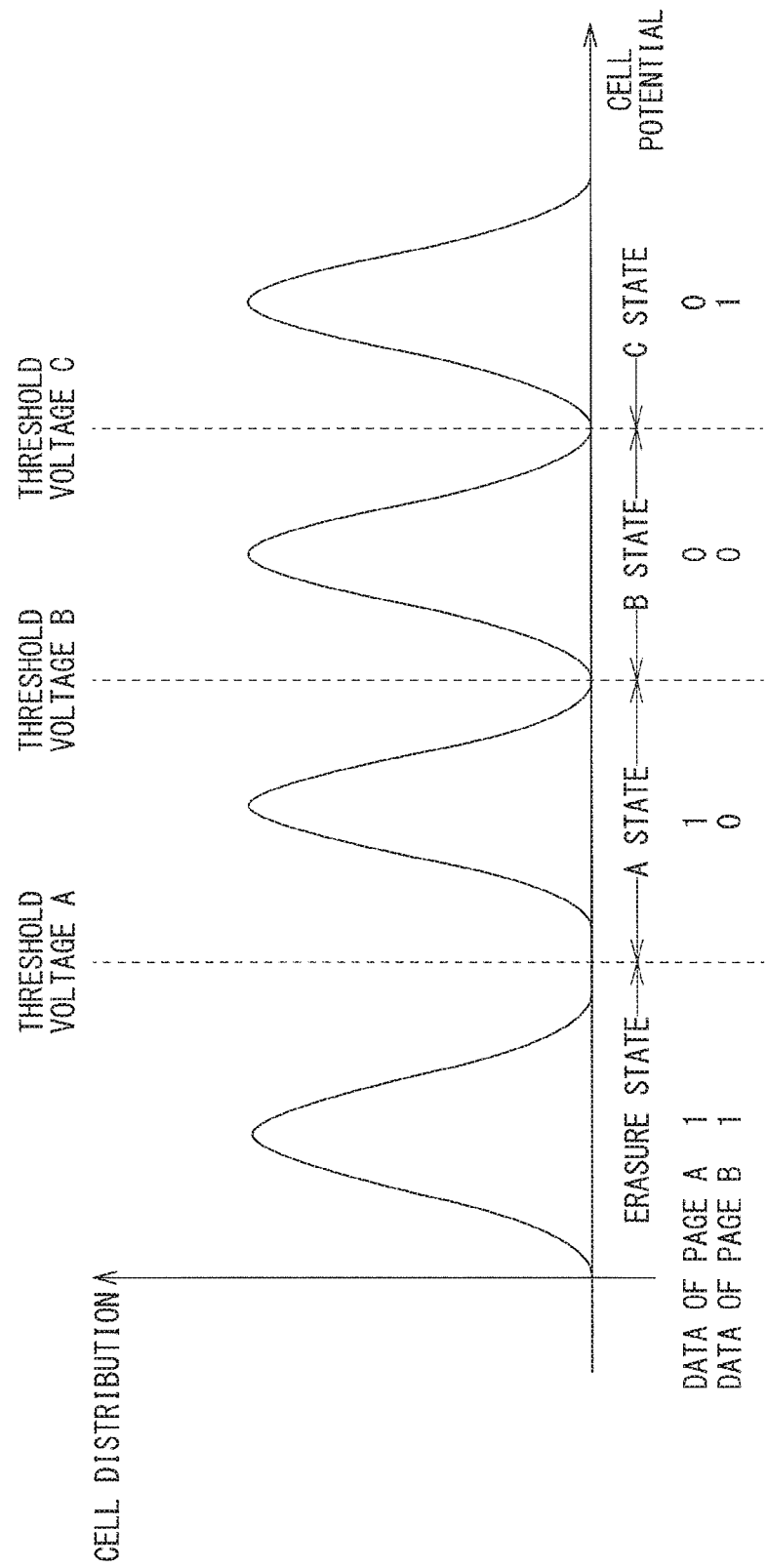

[ FIG. 10 ]
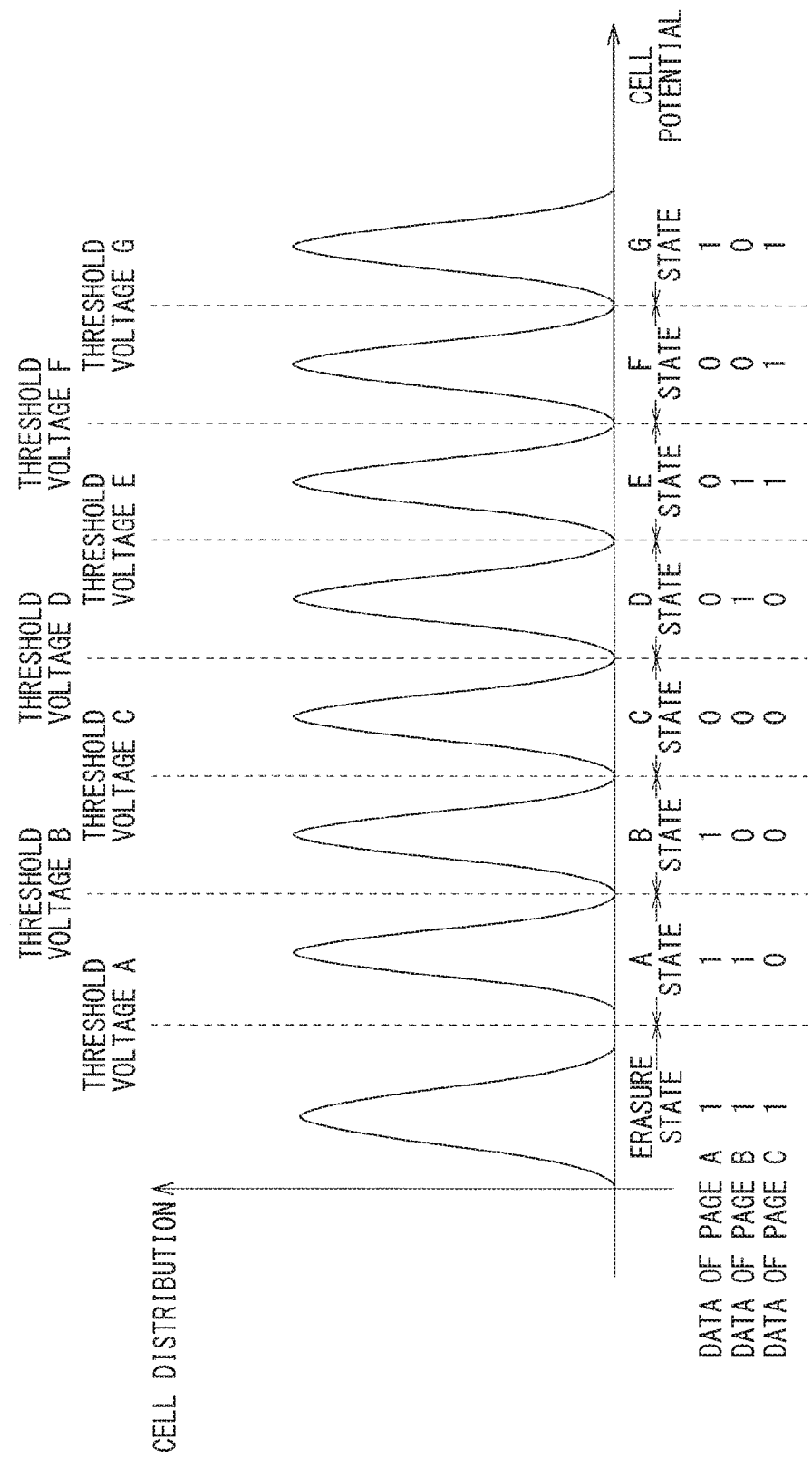

[ FIG. 11 ]

| | STATE | A | B | C | D | E | F | G |
|---|---|---|---|---|---|---|---|---|
| DATA BEFORE OVERWRITING | PAGE A 23 ERASURE | 1 | 1 | 0 | 0 | 0 | 0 | 1 |
| | PAGE B | 1 | 0 | 0 | 1 | 1 | 0 | 0 |
| | PAGE C | 0 | 0 | 0 | 0 | 1 | 1 | 1 |
| OVERWRITING DATA OF PAGE A (ALL 1) | | 1 | 1 | 1 | 1 | 1 | 1 | 1 |
| DATA OF PAGE A AFTER OVERWRITING | STATE ERASURE | A | B | C | D | E | F | G |
| | PAGE A | 1 | 1 | 0 | 0 | 0 | 0 | 1 |
| | PAGE B | 1 | 0 | 0 | 1 | 1 | 0 | 0 |
| | PAGE C | 0 | 0 | 0 | 0 | 1 | 1 | 1 |

[ FIG. 12 ]

| | STATE | ERASURE | A | B | C | D | E | F | G |
|---|---|---|---|---|---|---|---|---|---|
| DATA BEFORE OVERWRITING | PAGE A | 1 | 1 | 1 | 0 | 0 | 0 | 0 | 1 |
| | PAGE B | 1 | 1 | 0 | 0 | 1 | 1 | 0 | 0 |
| | PAGE C | 1 | 0 | 0 | 0 | 0 | 1 | 1 | 1 |
| OVERWRITING DATA OF PAGE B (ALL 1) | | 1 | 1 | 1 | 1 | 1 | 1 | 1 | 1 |
| DATA OF PAGE B AFTER OVERWRITING | STATE | ERASURE | A | B | C | D | E | F | G |
| | PAGE A | 1 | 1 | 1 | 0 | 0 | 0 | 0 | 1 |
| | PAGE B | 1 | 1 | 0 | 1 | 0 | 1 | 0 | 0 |
| | PAGE C | 1 | 0 | 0 | 0 | 0 | 1 | 1 | 1 |

[ FIG. 13 ]

| | STATE | ERASURE | A | B | C | D | E | F | G |
|---|---|---|---|---|---|---|---|---|---|
| DATA BEFORE OVERWRITING | PAGE A | 1 | 1 | 1 | 0 | 0 | 0 | 0 | 1 |
| | PAGE B | 1 | 1 | 0 | 0 | 1 | 1 | 0 | 0 |
| | PAGE C | 1 | 0 | 0 | 0 | 0 | 1 | 1 | 1 |
| OVERWRITING DATA OF PAGE C (ALL1) | | 0 | 0 | 0 | 0 | 0 | 0 | 0 | 0 |
| | STATE | A | A | B | C | D | E | F | G |
| DATA OF PAGE C AFTER OVERWRITING | PAGE A | 1 | 1 | 1 | 0 | 0 | 0 | 0 | 1 |
| | PAGE B | 1 | 1 | 0 | 0 | 1 | 1 | 0 | 0 |
| | PAGE C | 0 | 0 | 0 | 0 | 0 | 1 | 1 | 1 |

SEMICONDUCTOR MEMORY DEVICE AND METHOD OF ERASING DATA OF PARTIAL PAGE AND OVERWRITING PARTIAL PAGE WITH PREDETERMINED DATA

TECHNICAL FIELD

The disclosure relates to a semiconductor memory device and a method of erasing data in a semiconductor memory device.

BACKGROUND ART

A nonvolatile semiconductor memory such as an NAND flash memory includes a plurality of blocks each including a plurality of pages. Writing and reading of data is performed collectively in units of page but erasing of data is typically performed collectively in units of block.

CITATION LIST

Patent Literature

PTL 1: Japanese Unexamined Patent Application Publication No. 2014-96122

SUMMARY OF INVENTION

Therefore, to erase only data of a partial page in a block, it may be necessary to perform an operation of saving data of pages other than the page to be erased, to other block, etc. As a result, erasing only data of the partial page in the block may take a time longer than normal erasing. PTL 1 proposes a technique that speeds up erasing of only data of the partial page in the block; however, the technique may cause a waste region in the block. Further, data of pages other than the partial page to be erased may not be correctly read out.

It is desirable to provide a semiconductor memory device and a method of erasing data in a semiconductor device that both make it possible to securely erase data of a partial page in a block at high speed.

A semiconductor memory device according to an embodiment of the disclosure includes a block including a plurality of pages, and a controller that controls writing, erasing, and reading of data. Each of the pages includes a plurality of memory cells each being changeable to any of four or more states. In a case of erasing only a partial page of the plurality of pages, the controller overwrites the partial page with predetermined data that causes state change only by one stage.

A method of erasing data in a semiconductor memory device according to an embodiment of the disclosure including overwriting a partial page with predetermined data that causes state change only by one stage, in a case of erasing the partial page of a plurality of pages for the semiconductor memory device including a block that includes a plurality of pages, and each of the pages including a plurality of memory cells each being changeable to any of four or more states.

In the semiconductor memory device or the method of erasing data in the semiconductor memory device according to any of the embodiments of the disclosure, in the case of erasing only the partial page of the plurality of pages, the predetermined data that causes the state change only by one stage is overwritten on the partial page.

In the semiconductor memory device or the method of erasing data in the semiconductor memory device according to any of the embodiments of the disclosure, in the case of erasing only the partial page of the plurality of pages, the predetermined data that causes the state change only by one stage is overwritten on the partial page. This makes it possible to securely erase the data of the partial page in the block at high speed.

Note that effects described here are not necessarily limited, and any of effects described in the disclosure may be achieved.

BRIEF DESCRIPTION OF DRAWINGS

FIG. 1 is an explanatory diagram illustrating an example of a writing unit and an erasing unit of a typical nonvolatile semiconductor memory as a comparative example.

FIG. 2 is an explanatory diagram illustrating an operation example when data is erased in the typical nonvolatile semiconductor memory as the comparative example.

FIG. 3 is an explanatory diagram illustrating an example of a coupling phenomenon in the typical nonvolatile semiconductor memory as the comparative example.

FIG. 4 is a configuration diagram illustrating an example of a semiconductor memory device according to an embodiment of the disclosure.

FIG. 5 is a configuration diagram illustrating an example of a nonvolatile semiconductor memory.

FIG. 6 is an explanatory diagram illustrating an example of change of a state and data of a memory cell in a case where only a page A is erased in MLC.

FIG. 7 is an explanatory diagram illustrating an example of change of a state and data of a memory cell in a case where only the page A is erased after only a page B is erased in the MLC.

FIG. 8 is an explanatory diagram illustrating an example of change of a state and data of a memory cell in a case where only the page B is erased after only the page A is erased in the MLC.

FIG. 9 is an explanatory diagram illustrating an example of relationship of a cell potential of the MLC to states and data of each page.

FIG. 10 is an explanatory diagram illustrating an example of relationship of a cell potential of a TLC to states and data of each page.

FIG. 11 is an explanatory diagram illustrating an example of change of a state and data of a memory cell in a case where only a page A is erased in the TLC.

FIG. 12 is an explanatory diagram illustrating an example of change of a state and data of a memory cell in a case where only a page B is erased in the TLC.

FIG. 13 is an explanatory diagram illustrating an example of change of a state and data of a memory cell in a case where only a page C is erased in the TLC.

MODES FOR CARRYING OUT THE INVENTION

Some embodiments of the disclosure are described in detail below with reference to drawings. Note that description is given in the following order.

0. Outline and Issues of Nonvolatile Semiconductor Memory as Comparative Example (FIG. 1 to FIG. 3)
1. Embodiment of semiconductor memory device
   1.1 Configuration (FIG. 4 and FIG. 5)
   1.2 Operation (FIG. 6 to FIG. 13)
   1.3 Effects 2. Other embodiments <0. Outline and Issues of Nonvolatile Semiconductor Memory as Comparative Example>

FIG. 1 illustrates an example of a writing unit and an erasing unit of a typical nonvolatile semiconductor memory as a comparative example. FIG. 2 illustrates an operation example when data is erased in the typical nonvolatile semiconductor memory as the comparative example.

As illustrated in FIG. 1, a nonvolatile semiconductor memory such as an NAND flash memory includes a plurality of blocks 1 each including a plurality of pages 2. A memory cell that holds data is disposed at an intersection of a word line and a bit line. Data of one or a plurality of pages is stored in one word line. Writing and reading of data is collectively performed in units of the page 2. Erasing of data is collectively performed in units of the block 1. As described above, the writing and the reading of data and the erasing of data are performed in different units. Therefore, it is typically not possible to erase only data of a partial page 4 in the block 1, for example, as illustrated in an upper part of FIG. 2. In a case of erasing only the data of the partial page 4, data of the pages 2 other than a page to be erased is once saved to a RAM (Random Access Memory) on the controller or to other block 3, as illustrated in a middle part of FIG. 2. Thereafter, as illustrated in a lower part of FIG. 2, the data of the partial page 4 is erased by erasing data of the entire block 1. Note that, in a case where the data of the pages 2 other than the page to be erased is saved in the RAM, it is necessary to write the data saved in the block 1 or the other block 3 after the data of the entire block 1 is erased. Accordingly, in a case where only a portion of data in the block 1 is desired to be erased, reading and writing of effective data are repeated the necessary number of times, which takes time. In particular, much time is necessary in a case where the block 1 includes a large number of pages 2.

In contrast, PTL 1 (Japanese Unexamined Patent Application Publication No. 2014-96122) proposes two kinds of methods. In one of the methods, writing only one file in one block eliminates saving of data in erasing. The method causes an issue that waste regions are increased within the block in a case where a file having a small data amount is written. The other method is a method in which data is overwritten in a page to be erased to destroy data of the page to be erased. Writing of a nonvolatile semiconductor memory that demands erasing operation makes a transition only in a direction of increasing a cell potential. Therefore, if data is overwritten in the page in which data has been already written, the written data and the overwritten data may both possibly become unreadable.

FIG. 3 illustrates an example of a coupling phenomenon in a nonvolatile semiconductor memory.

PTL 1 proposes, as a data to be overwritten, random data and data having the highest cell potential. In an NAND flash memory, however, a phenomenon called coupling that is influenced by peripheral memory cells occurs. The coupling is a phenomenon in which a cell potential seems to change in reading in a case where a potential difference between a certain memory cell and an adjacent peripheral memory cell is large, as illustrated in FIG. 3. For example, as illustrated in FIG. 3, the potential seems to change to a reading potential higher than an original potential. In a case where overwriting is performed with a data pattern proposed in PTL 1, the potential of the memory cell of the overwritten page becomes high. As a result, cell potentials of respective pages on peripheral word lines, in particular, on word lines in before and behind seem to be high in some cases. If the cell potential seems to be high, the written data may not be correctly read out in some cases, which may possibly result in unintentional data destruction.

1. Embodiment of Semiconductor Memory Device

[1.1 Configuration]

FIG. 4 illustrates an example of a semiconductor memory device 11 according to an embodiment of the disclosure.

The semiconductor memory device 11 according to the present embodiment includes a nonvolatile semiconductor memory 12, a controller 13, and a host I/F (interface) 14.

The nonvolatile semiconductor memory 12 is, for example, an NAND flash memory. The nonvolatile semiconductor memory 12 includes a plurality of blocks 1 each including a plurality of pages 2, substantially similar to the comparative example illustrated in FIG. 1. Operation of the nonvolatile semiconductor memory 12 is controlled by the controller 13. The host I/F 14 is an interface that couples the controller 13 and a host apparatus 10 such as a PC (personal computer) to each other.

As illustrated in FIG. 5, the nonvolatile semiconductor memory 12 has a matrix configuration in which word lines (WLs) 21 and bit lines (BLs) 22 intersect with one another. A memory cell 23 is disposed at an intersection of each of the WLs 21 and each of the BLs 22. Selection lines 24 determine voltages of the respective BLs 22 in order to determine values to be written in the respective memory cells 23 in writing. Data of one or a plurality of pages are stored in one word line 21.

For example, the memory cell 23 has a configuration of MLC (multilevel cell) or TLC (triple level cell). In a case of the MLC, data of two bits is storable in one memory cell 23, and data of two pages is stored in one WL 21. In a case of the TLC, data of three bits is storable in one memory cell 23, and data of three pages is stored in one WL 21.

[1.2 Operation]

In a case where the host apparatus 10 writes data in the nonvolatile semiconductor memory 12, write data is transmitted to the controller 13 through the host I/F 14. The controller 13 writes, in the nonvolatile semiconductor memory 12, data that has been scrambled by, for example, output of a linear feedback shift register (LFSR) in order to suppress influence of coupling with the adjacent memory cell 23. The controller 13 determines a position where data is written, and holds information of the write position that is called logical-physical conversion table.

In a case where the host apparatus 10 reads out data from the nonvolatile semiconductor memory 12, a read address is notified to the controller 13 through the host I/F 14. The controller 13 uses the logical-physical conversion table to acquire a position where the data has been written, reads out the data from the nonvolatile semiconductor memory 12, descramble the data, and then transmits the data to the host through the host I/F 14.

In a case where the host apparatus 10 erases data in the nonvolatile semiconductor memory 12, an erasure address is notified to the controller 13 through the host I/F 14. The controller 13 uses the logical-physical conversion table to acquire a position where the data has been written. Note that, if data in the logical-physical conversion table is rewritten, it is normally not possible for the host apparatus 10 to read out data from the nonvolatile semiconductor memory 12. In such a case, however, data may be possibly read out when a measurement instrument is coupled to a terminal of the nonvolatile semiconductor memory 12 because the data remains in the nonvolatile semiconductor memory 12. Therefore, to securely erase data, it is necessary to erase the page 2 in which the data has been written. In a case where the controller 13 confirms that effective data does not remain in other pages 2 in the same block 1, the controller 13 performs erasing processing of the block 1. If effective data remains, the controller 13 overwrites the page 2 in which the data to be erased has been written, with predetermined data described later, and deletes the logical-physical conversion table of the corresponding address.

Specific examples of operation of erasing data in a case where the memory cell 23 is the MLC and in a case where the memory cell 23 is the TLC are described below.

[Example of Erasing Operation in Case of MLC]

FIG. 9 illustrates an example of relationship of a cell potential of the MLC to a state and data of each of pages A and B. In the case of the MLC, data of two bits is storable in one memory cell 23, and data of two pages is stored in one WL 21. Here, a first page on one WL 21 is referred to as the page A. and a second page is referred to as the page B. The page B is higher in order than the page A. Further, one memory cell 23 may take four states of an erasure state, an A state, a B state, and a C state. A state with higher cell potential is referred to as a high-order state, and a state with lower cell potential is referred to as a low-order state. The lowest-order state is the erasure state, and the highest-order state is the C state. A threshold voltage between the erasure state and the A state is a threshold voltage A, a threshold voltage between the A state and the B state is a threshold voltage B, and a threshold voltage between the B state and the C state is a threshold C.

In a case where only data of the partial page 4 is erased in consideration of the relationship between the cell potential and the state as illustrated in FIG. 9, the controller 13 creates predetermined data that causes state change of each of the memory cells 23 only by one stage, and overwrites the partial page 4 to be erased with the predetermined data. In particular, the controller 13 creates the predetermined data that causes state change only by one stage from low-order to high-order and performs overwriting. Note that, since data to be written is normally scrambled, the number of memory cells 23 at respective voltage levels is not largely different in units of block and in units of page.

FIG. 6 illustrates an example of change of the state and the data of the memory cell 23 in a case where only data of the page A is erased in the MLC. The controller 13 reads out the written data of a plurality of pages including the partial page 4 to be erased, and creates the predetermined data that is to be overwritten on the page A, on the basis of the readout data. Specifically, in the case of erasing the page A, the controller 13 reads out the data of the page A and data of the page B, and calculates logical products of respective corresponding bits of the data, thereby generating the predetermined data. The predetermined data is overwritten on the page A. The states of the respective memory cells 23 are changed as illustrated in FIG. 6, through the writing. As illustrated in FIG. 6, the data of the page B is retained also after the predetermined data is overwritten on the page A. In contrast, bits of about ¼ of the data of the page A are inverted from one to zero, which causes correct data to be unavailable. This substantially erases the data of the page A. In addition, at this time, the states of the respective memory cells 23 in the page A are raised only by one stage even if the states are changed. This makes it possible to suppress influence on data written in other pages 2 of the WLs 21 before and behind the WL 21 that includes the partial page 4 to be erased.

FIG. 7 illustrates an example of change of the state and the data of the memory cell 23 in a case where only the page B is erased and only the page A is then erased in the MLC. In a case where only the page B as the partial page 4 is erased before the page A is erased, the controller 13 overwrites all of the memory cells 23 in the page B with data of "1" as the predetermined data. The states of the respective memory cells 23 are changed as illustrated in FIG. 7 through the writing. As illustrated in FIG. 7, since only the memory cells 23 in the B state are changed to the C state, the data of the page A is retained also after the predetermined data is overwritten on the page B. In contrast, bits of about ¼ of the data of the page B are inverted from zero to one, which causes correct data to be unavailable. This substantially erases the data of the page B. In addition, at this time, the states of the respective memory cells 23 in the page B are raised only by one stage even if the states are changed. This makes it possible to suppress influence on data written in other pages 2 on the WLs 21 before and behind the WL 21 that includes the partial page 4 to be erased.

In a case where the page A as the partial page 4 is erased after the page B is erased, the data of the page A and the data of the page B are read out, logical products of the respective corresponding bits of the data are calculated to generate the predetermined data, in a manner similar to the above-described example in FIG. 6. The predetermined data is overwritten on the page A. The states of the respective memory cells 23 are changed as illustrated in FIG. 7 through the writing. As illustrated in FIG. 7, the data of the page B is retained also after the predetermined data is overwritten on the page A. In contrast, bits of about ¼ of the data of the page A are inverted from one to zero, which causes correct data to be unavailable. This substantially erases the data of the page A. In addition, at this time, the states of the respective memory cells 23 in the page A are raised only by one stage at maximum, as compared with the states before the page B is erased. This makes it possible to suppress influence on data written in other pages 2 on the WLs 21 before and behind the WL 21 that includes the partial page 4 to be erased.

FIG. 8 illustrates an example of change of the state and the data of the memory cell 23 in a case where only the page A is erased and only the page B is then erased in the MLC. First, the operation of erasing only the page A as the partial page 4 is similar to the operation in the above-described example in FIG. 6. Thereafter, in a case where only the data of the page B as the partial page 4 is further erased, the controller 13 overwrites all of the memory cells 23 in the page B with data of "0" as the predetermined data. The states of the respective memory cells 23 are changed as illustrated in FIG. 8 through the writing. As compared with the states before the page A is erased, only the memory cells 23 in the erasure state and the A state are respectively raised to the states by one stage, and bits of about ¼ of the data of the page A and the page B are inverted from one to zero, which causes correct data to be unavailable. This substantially erases the data of the page A and the page B. At this time, as compared with the states before the page A is erased, the states of the respective memory cells 23 in the page A and the page B are raised only by one stage at maximum. This makes it possible to suppress influence on data written in other pages 2 on the WLs 21 before and behind the WL21 that includes the partial page 4 to be erased.

[Example of Erasing Operation in Case of TLC]

FIG. 10 illustrates an example of relationship of a cell potential of the TLC to a state and data of each of pages A, B, and C. In the case of the TLC, data of three bits is storable in one memory cell 23, and data of three pages are stored in one WL 21. Here, a first page on one WL 21 is referred to as the page A, a second page is referred to as the page B, and a third page is referred to as the page C. The page B is higher in order than the page A, and the page C is higher in order than the page B. Further, one memory cell 23 may possibly take eight states of an erasure state, an A state, a B state, a C state, a D state, an E state, an F state, and a G state. A state with higher cell potential is referred to as a high-order state, and a state with lower cell potential is referred to as a low-order state. The lowest-order state is the erasure state, and the highest-order state is the G state. A threshold voltage between the erasure state and the A state is a threshold voltage A, a threshold voltage between the A state and the B state is a threshold voltage B, and a threshold voltage between the B state and the C state is a threshold voltage C. In addition, a threshold voltage between the C state and the D state is a threshold voltage D, a threshold voltage between the D state and the E state is a threshold voltage E, a threshold voltage between the E state and the F state is a threshold voltage F, and a threshold voltage between the F state and the G state is a threshold voltage G.

In a case where only the partial page 4 is erased in consideration of the relationship between the cell potential and the state as illustrated in FIG. 10, the controller 13 creates or selects the predetermined data that causes state change of each of the memory cells 23 only by one stage, and overwrites, with the predetermined data, the partial page 4 to be erased. In particular, the controller 13 creates or selects the predetermined data that causes state change only by one stage from low-order to high-order and performs overwriting. Unlike the example of the MLC described above, in a case where the page A or the page B is erased as the partial page 4 to be erased irrespective of order of pages to be erased and the written data, data of "1" as the predetermined data is overwritten on all of the memory cells 23 in the page A or the page B. In addition, in a case where the page C as the partial page 4 to be erased is erased, data of "0" as the predetermined data is overwritten on all of the memory cells 23 in the page C. In each of the cases, the states of the respective memory cells 23 are changed as illustrated in FIG. FIG. 11 to FIG. 13 through the writing.

FIG. 11 illustrates an example of change of the state and the data of the memory cell 23 in a case where only the page A is erased in the TLC. FIG. 12 illustrates an example of change of the state and the data of the memory cell 23 in a case where only the page B is erased in the TLC. FIG. 13 illustrates an example of change of the state and the data of the memory cell 23 in a case where only the page C is erased in the TLC.

As illustrated in FIG. 11, in a case where data of "1" as the predetermined data is overwritten on the page A, the memory cell 23 in the F state in the page A is changed to the G state. Further, as illustrated in FIG. 12, in a case where data of "1" as the predetermined data is overwritten on the page B, the memory cell 23 in the C state in the page B is changed to the D state. Furthermore, as illustrated in FIG. 13, in a case where data of "0" as the predetermined data is overwritten on the page C, the memory cell 23 in the erasure state in the page C is changed to the A state.

In each of the cases as illustrated in FIG. 11 to FIG. 13 described above, after the predetermined data is overwritten, it is not possible to acquire correct data for the partial page 4 to be erased, and the data is substantially erased. In contrast, data of the two pages 2 other than the page to be erased is retained. Moreover, in both of the foregoing cases, the states of the respective memory cells 23 in the partial page 4 to be erased are raised only by one stage even if the states are changed. This makes it possible to suppress influence on data written in other pages 2 of the WLs 21 before and behind the WL 21 that includes the partial page 4 to be erased.

As described above, a data pattern of the predetermined data is determined on the basis of the state of the current page and the state of the data, and the predetermined data is overwritten on the partial page 4 to be erased. This makes it possible to suppress influence on other pages 2 of the WLs 21 before and behind the WL 21 that includes the partial page 4 to be erased while securely erasing the data at high speed.

[1.3 Effects]

As described above, according to the present embodiment, the predetermined data that causes state change only by one stage is overwritten on the partial page 4 in the case where only the partial page 4 is erased. This makes it possible to securely erase the data of the partial page 4 in the block 1 at high speed. As a result, for example, in a case where it is necessary to securely erase data in a memory card, it becomes possible to erase the data at high speed without influencing data of other WLs 21.

Note that effects described in the present specification are illustrative and non-limiting, and other effects may be achieved.

2. Other Embodiments

The technology of the disclosure is not limited to the description of the embodiments described above, and may be variously modified.

For example, the technology may have any of the following configurations.

(1)

A semiconductor memory device, including:

a block including a plurality of pages; and a controller that controls writing, erasing, and reading of data, in which each of the pages includes a plurality of memory cells each being changeable to any of four or more states, and in a case of erasing only a partial page of the plurality of pages, the controller overwrites the partial page with predetermined data that causes state change only by one stage.

(2)

The semiconductor memory device according to (1), further including a plurality of word lines and a plurality of bit lines, in which the memory cells are disposed at respective intersections of the plurality of word lines and the plurality of bit lines, and data of a plurality of pages is stored on each one of the plurality of word lines.

(3)

The semiconductor memory device according to (1) or (2), in which the controller reads out written data in the plurality of pages including the partial page, and generates the predetermined data on the basis of the readout data.

(4)

The semiconductor memory device according to (2), in which the plurality of pages on each of the word lines include a first page and a second page, and in a case where the first page as the partial page is erased, the controller overwrites all of the memory cells in the first page with, as the predetermined data, data of a logical product of the first page and the second page.

(5)

The semiconductor memory device according to (2), in which
the plurality of pages include a first page and a second page,
the controller
overwrites all of the memory cells in the second page with data of "1" as the predetermined data in a case where the second page as the partial page is erased before the first page is erased, and
overwrites all of the memory cells in the first page with, as the predetermined data, data of a logical product of the first page and the second page in a case where the first page as the partial page is further erased after the second page is erased.

(6)

The semiconductor memory device according to (2), in which
the plurality of pages include a first page and a second page,
the controller
overwrites all of the memory cells in the first page with, as the predetermined data, data of a logical product of the first page and the second page in a case where the first page is erased as the partial page, and
overwrites all of the memory cells in the second page with data of "0" as the predetermined data in a case where the second page as the partial page is further erased thereafter.

(7)

The semiconductor memory device according to any one of (1) to (6), in which the state of the memory cell is changeable among four states.

(8)

The semiconductor memory device according to (2), in which
the plurality of pages on each one of the word lines include first to third pages,
the controller
overwrites all of the memory cells in the first page or all of the memory cells in the second page with data of "1" as the predetermined data in a case where the first page or the second page as the partial page is erased, and
overwrites all of the memory cells in the third page with data of "0" as the predetermined data in a case where the third page as the partial page is erased.

(9)

The semiconductor memory device according to (8), in which the state of the memory cell is changeable among eight states.

(10)

A method of erasing data in a semiconductor memory device, the semiconductor memory device including a block that includes a plurality of pages, and each of the pages including a plurality of memory cells each being changeable to any of four or more states, the method including,
in a case of erasing a partial page of the plurality of pages, overwriting the partial page with predetermined data that causes state change only by one stage.

This application is based upon and claims the benefit of priority of the Japanese Patent Application No. 2015-181628 filed with the Japan Patent Office on Sep. 15, 2015, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. A semiconductor memory device, comprising:
a block including a plurality of pages;
a controller configured to control writing, erasing, and reading of data, wherein
each of the pages includes a plurality of memory cells each being changeable to one of four or eight states, and
in a case of erasing only a partial page of the plurality of pages, the controller overwrites the partial page with predetermined data that causes state change only by one stage; and
a plurality of word lines and a plurality of bit lines, wherein
the memory cells are disposed at respective intersections of the plurality of word lines and the plurality of bit lines, and
data of a plurality of pages is stored on each one of the plurality of word lines,
wherein
the plurality of pages on each one of the word lines include first to third pages, and
the controller is configured to
overwrite all of the memory cells in the first page or all of the memory cells in the second page with data of "1" as the predetermined data in a case where the first page or the second page as the partial page is erased, and
overwrite all of the memory cells in the third page with data of "0" as the predetermined data in a case where the third page as the partial page is erased.

2. The semiconductor memory device according to claim 1, wherein the controller reads out written data in the plurality of pages including the partial page, and generates the predetermined data on the basis of the readout data.

3. A semiconductor memory device comprising:
a block including a plurality of pages;
a controller configured to control writing, erasing, and reading of data, wherein
each of the pages includes a plurality of memory cells each being changeable to one of four or eight states, and
in a case of erasing only a partial page of the plurality of pages, the controller overwrites the partial page with predetermined data that causes state change only by one stage; and
a plurality of word lines and a plurality of bit lines, wherein
the memory cells are disposed at respective intersections of the plurality of word lines and the plurality of bit lines, and
data of a plurality of pages is stored on each one of the plurality of word lines, wherein
the plurality of pages on each of the word lines include a first page and a second page, and
in a case where the first page as the partial page is erased, the controller overwrites all of the memory cells in the first page with, as the predetermined data, data of a logical product of the first page and the second page.

4. A semiconductor memory device comprising:
a block including a plurality of pages;
a controller configured to control writing, erasing, and reading of data, wherein
each of the pages includes a plurality of memory cells each being changeable to one of four or eight states, and in a case of erasing only a partial page of the plurality of pages, the controller overwrites the partial page with predetermined data that causes state change only by one stage; and a plurality of word lines and a plurality of bit lines, wherein the memory cells are disposed at respective intersections of the plurality of word lines and the plurality of bit lines, and data of a plurality of pages is stored on each one of the plurality of word lines, wherein the plurality of pages include a first page and a second page, and the controller is configured to overwrite all of the memory cells in the second page with data of "1" as the predetermined data in a case where the second page as the partial page is erased before the first page is erased, and overwrite all of the memory cells in the first page with, as the predetermined data, data of a logical product of the first page and the second page in a case where the first page as the partial page is further erased after the second page is erased.

5. A semiconductor memory device comprising:
a block including a plurality of pages;
a controller configured to control writing, erasing, and reading of data, wherein
each of the pages includes a plurality of memory cells each being changeable to one of four or eight states, and
in a case of erasing only a partial page of the plurality of pages, the controller overwrites the partial page with predetermined data that causes state change only by one stage; and
a plurality of word lines and a plurality of bit lines, wherein
the memory cells are disposed at respective intersections of the plurality of word lines and the plurality of bit lines, and
data of a plurality of pages is stored on each one of the plurality of word lines, wherein
the plurality of pages include a first page and a second page, and
the controller is configured to
overwrite all of the memory cells in the first page with, as the predetermined data, data of a logical product of the first page and the second page in a case where the first page is erased as the partial page, and
overwrite all of the memory cells in the second page with data of "0" as the predetermined data in a case where the second page as the partial page is further erased thereafter.

6. The semiconductor memory device according to claim 1, wherein the state of the memory cell is changeable among four states.

7. The semiconductor memory device according to claim 1, wherein the state of the memory cell is changeable among eight states.

8. A method of erasing data in a semiconductor memory device, the semiconductor memory device including a block that includes a plurality of pages, and each of the pages including a plurality of memory cells each being changeable to one of four or eight states, the method comprising:
in a case of erasing a partial page of the plurality of pages, overwriting the partial page with predetermined data that causes state change only by one stage, wherein the plurality of pages include first to third pages, and wherein
overwriting the partial page comprises
overwriting all of the memory cells in the first page or all of the memory cells in the second page with data of a first value as the predetermined data in a case where the first page or the second page as the partial page is erased, and
overwriting all of the memory cells in the third page with data of a second value as the predetermined data in a case where the third page as the partial page is erased,
wherein the first value is one and the second value is zero.

9. A semiconductor memory device comprising:
a block including a plurality of pages;
a controller configured to control writing, erasing, and reading of data, wherein
each of the pages includes a plurality of memory cells each being changeable to one of four or eight states, and
in a case of erasing only a partial page of the plurality of pages, the controller overwrites the partial page with predetermined data that causes state change only by one stage, wherein
the plurality of pages include first to third pages, and
the controller is configured to
overwrite all of the memory cells in the first page or all of the memory cells in the second page with data of a first value as the predetermined data in a case where the first page or the second page as the partial page is erased, and
overwrite all of the memory cells in the third page with data of a second value as the predetermined data in a case where the third page as the partial page is erased, and
wherein the first value is one and the second value is zero.

* * * * *